United States Patent
Wahl et al.

(10) Patent No.: US 7,554,157 B2
(45) Date of Patent: Jun. 30, 2009

(54) LATERAL SOI COMPONENT HAVING A REDUCED ON RESISTANCE

(75) Inventors: Uwe Wahl, Munich (DE); Ralf Rudolf, Dresden (DE); Dirk Priefert, Moers (DE)

(73) Assignee: Infineon Technologies Austria AG, Villach (AT)

( * ) Notice: Subject to any disclaimer, the term of this patent is extended or adjusted under 35 U.S.C. 154(b) by 277 days.

(21) Appl. No.: 11/527,760

(22) Filed: Sep. 26, 2006

(65) Prior Publication Data
US 2007/0080395 A1   Apr. 12, 2007

(30) Foreign Application Priority Data
Sep. 26, 2005   (DE) .................. 10 2005 045 910

(51) Int. Cl.
H01L 27/12   (2006.01)
H01L 29/76   (2006.01)

(52) U.S. Cl. ................. 257/347; 257/330; 257/335; 257/494; 257/E21.356; 257/E21.358

(58) Field of Classification Search ............... 257/119, 257/330, 335, 347, 379, 494
See application file for complete search history.

(56) References Cited

U.S. PATENT DOCUMENTS

| | | | |
|---|---|---|---|
| 4,941,026 A | 7/1990 | Temple | |
| 5,886,384 A * | 3/1999 | Soderbarg et al. | 257/347 |
| 6,693,327 B2 | 2/2004 | Priefert et al. | |
| 7,202,526 B2 * | 4/2007 | Kitagawa et al. | 257/335 |
| 2002/0113275 A1 * | 8/2002 | Stecher et al. | 257/379 |

FOREIGN PATENT DOCUMENTS

| | | |
|---|---|---|
| DE | 43 09 764 C2 | 1/1997 |
| DE | 101 06 359 C1 | 9/2002 |
| EP | 0 382 165 A2 | 8/1990 |
| WO | WO 2005/076366 A2 | 8/2005 |

* cited by examiner

Primary Examiner—Dao H Nguyen
(74) Attorney, Agent, or Firm—Maginot, Moore & Beck

(57) ABSTRACT

An SOI semiconductor component comprises a semiconductor substrate having a basic doping, a dielectric layer arranged on the semiconductor substrate, and a semiconductor layer arranged on the dielectric layer. The semiconductor layer includes a drift zone of a first conduction type, a junction between the drift zone and a further component zone which is configured in such a way that a space charge zone is formed in the drift zone when a reverse voltage is applied to the junction, and a terminal zone adjacent to the drift zone. A first terminal electrode is connected to the further component zone, and a second terminal electrode is connected to the terminal zone. In the semiconductor substrate a first semiconductor zone is doped complementarily with respect to a basic doping of the semiconductor substrate, and the first terminal electrode is connected to the first semiconductor zone. A rectifier element is connected between the first terminal electrode and the first semiconductor zone.

20 Claims, 6 Drawing Sheets

LATERAL SOI COMPONENT HAVING A REDUCED ON RESISTANCE

FIELD

The present invention relates to a semiconductor component, and particularly a lateral SOI component having a semiconductor substrate, an insulation layer applied to the semiconductor substrate, and a semiconductor layer arranged on the insulation layer, and also having first and second terminal contacts for applying a voltage, between which a drift zone is arranged in the semiconductor layer.

BACKGROUND

In a component as mentioned above, the drift zone serves to take up, in the off state, a space charge zone that propagates proceeding from a component junction between the drift zone and a further component zone. In the case of a MOSFET or IGBT, said component junction is a pn junction and the further component zone is the body zone of the MOSFET or IGBT, said body zone being doped complementarily with respect to the drift zone. In the case of a diode, the component junction is likewise a pn junction and the further component zone is that zone from among the anode and cathode zones which is doped complementarily with respect to the drift zone. In the case of a Schottky diode, the component junction is a Schottky junction and the further component zone is a Schottky contact.

An SOI component realized as a MOSFET is described in DE 101 06 359 C1 or WO 2005/076366 A2, the source terminal and drain terminal of said component being connected to the semiconductor substrate via semiconductor zones doped complementarily with respect to the semiconductor substrate. In this case, the terminal of the terminal contacts to the semiconductor substrate has the effect that, when the component is driven in the off state, a space charge zone propagates in the semiconductor substrate as well as in the drift zone along the insulation layer. Said space charge zone leads to a reduction of the voltage loading on the insulation layer. In order to influence the field distribution in the semiconductor substrate, even further semiconductor zones doped complementarily with respect to the semiconductor substrate, so-called field zones, may be provided in the substrate beneath the insulation layer.

When realizing semiconductor components having a drift zone, it is desirable, in principle, to achieve a highest possible dielectric strength when the component is driven in the off state and a lowest possible on resistance when the component is driven in the on state. However, the optimization of one of these component parameters is usually detrimental to the other of the two parameters unless additional measures are implemented. Thus, a reduction of the on resistance can be achieved for example by means of an increased doping of the drift zone. However, the dielectric strength decreases in this case.

Additional measures which lead to a high dielectric strength despite a high doping of the drift zone consist, in the case of so-called compensation components, in providing in the drift zone compensation zones that are doped complementarily with respect to a drift zone. Compensation components of this type are described for example in U.S. Pat. No. 5,438,215 or DE 43 09 764 C2.

In the case of field plate components described for example in U.S. Pat. Nos. 4,903,189 or 4,941,026, provision is made of a field plate that is arranged adjacent to the drift zone and is insulated dielectrically from the drift zone. Said field plate comprises a metal or a highly doped polysilicon and is at a predetermined potential, for example the potential of one of the load terminals of the component. Said field plate serves, in the off-state case, to compensate for a portion of the dopant charge present in the drift zone. This compensation effect enables a higher doping of the drift zone, and hence a lower on resistance, for the same dielectric strength of the component.

U.S. Pat. No. 5,844,272 describes a lateral MOSFET in which the gate electrode is arranged adjacent to a body zone and has a more weakly doped gate extension that runs along the drift zone and is insulated from the drift zone by means of a dielectric layer. When the component is driven in the on state, the gate extension brings about the formation of an accumulation channel in the drift zone along the dielectric layer and thus brings about a reduction of the on resistance. In the off-state case, a space charge zone that depletes the gate extension of charge carriers likewise forms in the gate extension due to a space charge zone that propagates in the drift zone.

Accordingly, it would be desirable to provide an SOI component having a high dielectric strength and a low on resistance.

SUMMARY

The SOI semiconductor component according to at least one embodiment of the invention comprises a semiconductor substrate having a basic doping, a dielectric layer arranged on the semiconductor substrate, and a semiconductor layer arranged on the dielectric layer. A drift zone of a first conduction type and a junction between the drift zone and a further component zone are arranged in the semiconductor layer, said further component zone being configured in such a way that a space charge zone is formed in the drift zone when a reverse voltage is applied to the junction.

The SOI semiconductor component may be formed as a MOS transistor, that is to say as a MOSFET, or as an IGBT, the further component zone in this case being a body zone doped complementarily with respect to the drift zone. The component may also be formed as a diode, the further component zone in this case forming one of the anode and cathode zones of the diode. There is furthermore the possibility of forming the semiconductor component as a Schottky diode, in which case the further component zone is a Schottky metal zone.

In the case of the component according to at least one embodiment of the invention, a terminal zone is adjacent to the drift zone in the semiconductor layer, which terminal zone forms the drain zone in the case of a MOS transistor and is doped by the same conduction type as the drift zone in the case of a MOSFET and complementarily with respect to the drift zone in the case of an IGBT. In the case where the semiconductor component is realized as a diode, the terminal zone forms the respective other of the anode and cathode zones. In the case where the component is realized as a Schottky diode, the terminal zone forms the cathode zone of the component and is doped by the same conduction type as the drift zone but more highly.

The component according to the at least one embodiment of the invention additionally comprises a first terminal electrode, which is connected to the further component zone, and a second terminal electrode, which is connected to the terminal zone. The first and second terminal electrodes are connected to first and second semiconductor zones in the semiconductor substrate which are arranged at a distance from one another and which are doped complementarily with respect to a basic doping of the semiconductor substrate. In this case, provision is made for connecting a rectifier element between one of said first and second terminal electrodes and the associated one of the first and second semiconductor zones. Said rectifier element is connected up in such a way that the electrical potential in the semiconductor substrate in the region of the semiconductor zone to which it is connected can rise to a potential that lies above the potential of the associated terminal electrode. When the component is driven in the on state, said rectifier element, in a manner yet to be explained, supports the formation of an accumulation channel in the drift zone of the semiconductor layer under the control of the potential of the semiconductor substrate.

The rectifier element may be realized for example as a diode, as a Zener diode or else as a MOSFET connected up as a diode.

In one suitable embodiment, at least one field zone that is doped complementarily with respect to the basic doping of the semiconductor substrate is present in the semiconductor substrate between the first and second semiconductor zones adjacent to the dielectric layer. Said field zone serves together with the first and second semiconductor zones, when the component is in the off state, in a known manner for influencing the field profile of the electric field in the semiconductor substrate in such a way that a voltage loading on the dielectric layer is reduced. When the component is driven in the off state, said field zones furthermore have a compensation effect and compensate for a portion of the dopant charge present in the drift zone. This enables the drift zone to be doped more highly in regions adjacent to said at least one field zone than in the remaining regions, as a result of which the on resistance is reduced when the component is in the on state, without reducing the dielectric strength when the component is in the off state, however.

Moreover, field plates may be provided above the semiconductor layer in a manner that is known in principle, which field plates are insulated from the semiconductor layer by means of a dielectric layer and may optionally be electrically coupled to the field zone or the field zones in the semiconductor substrate.

The above described features and advantages, as well as others, will become more readily apparent to those of ordinary skill in the art by reference to the following detailed description and accompanying drawings.

BRIEF DESCRIPTION OF THE DRAWINGS

In the figures, unless specified otherwise, identical reference symbols designate identical component zones with the same meaning.

DESCRIPTION

Figure 1:
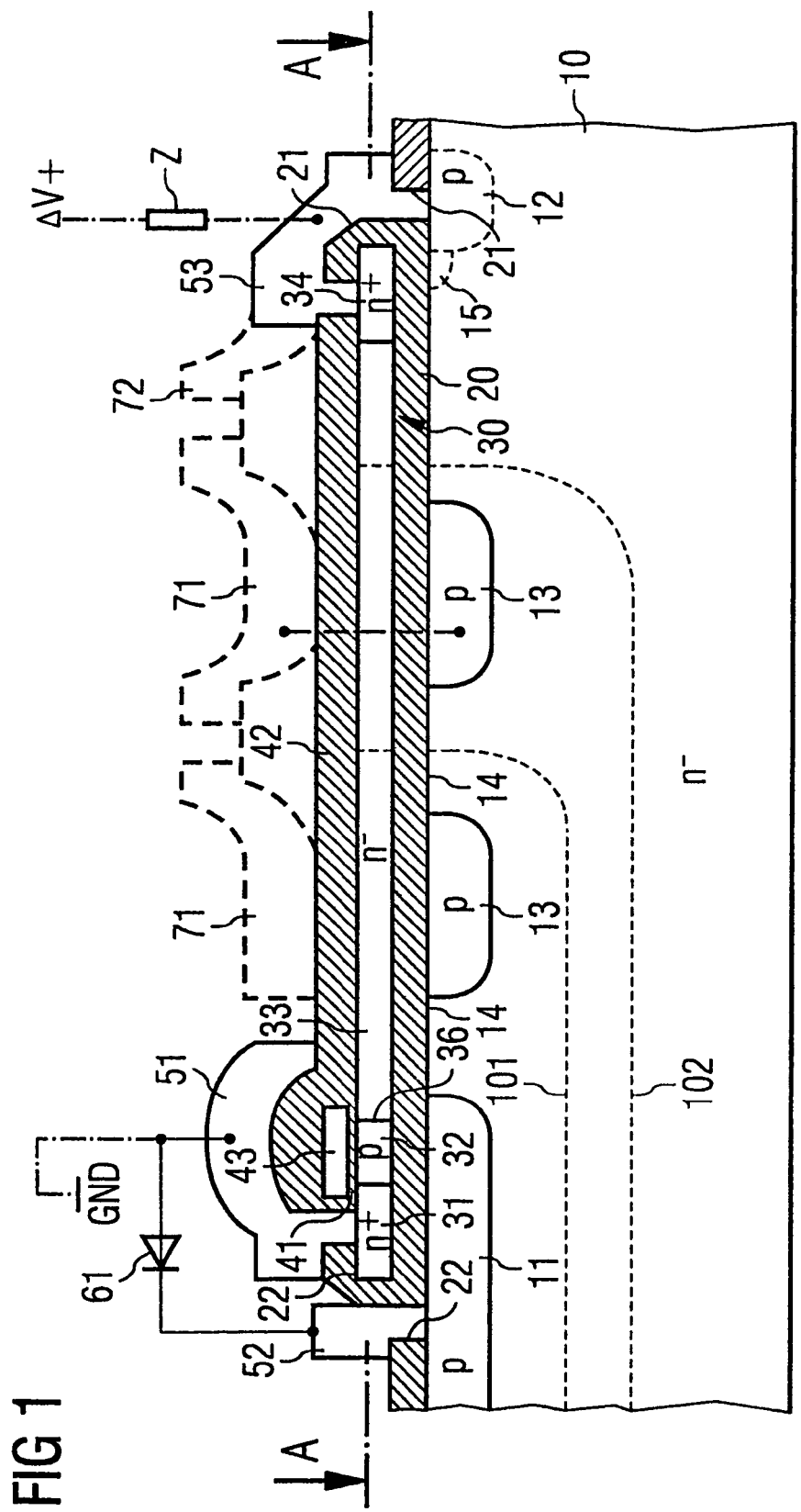
FIG. 1 shows a first exemplary embodiment of an SOI semiconductor component according to at least one embodiment of the invention in cross section, which component has a drift zone in a semiconductor layer above a semiconductor substrate and is realized as a MOSFET.

FIG. 1 shows an exemplary embodiment of an SOI semiconductor component according to at least one embodiment of the invention that is realized as a MOS transistor. As used herein, the term MOS transistor is to be understood to mean either a MOSFET or an IGBT.

The component as shown in FIG. 1 has a semiconductor layer 30 arranged on a dielectric layer 20 above a semiconductor substrate 10. A cross section through the semiconductor layer 30 in a sectional plane A-A depicted in FIG. 1 is illustrated in FIG. 3.

In order to realize a MOS transistor structure, a drift zone 33 of a first conduction type, a body zone 32 doped complementarily with respect to the drift zone 33 and situated adjacent to the drift zone 33, and also a source zone 31 are present in the semiconductor layer 30. The source zone 31 is doped by the same conduction type as the drift zone 33 but more highly and is separated from the drift zone 33 by the body zone 32. A first terminal electrode 51 makes contact with the source zone 31.

Figure 3:
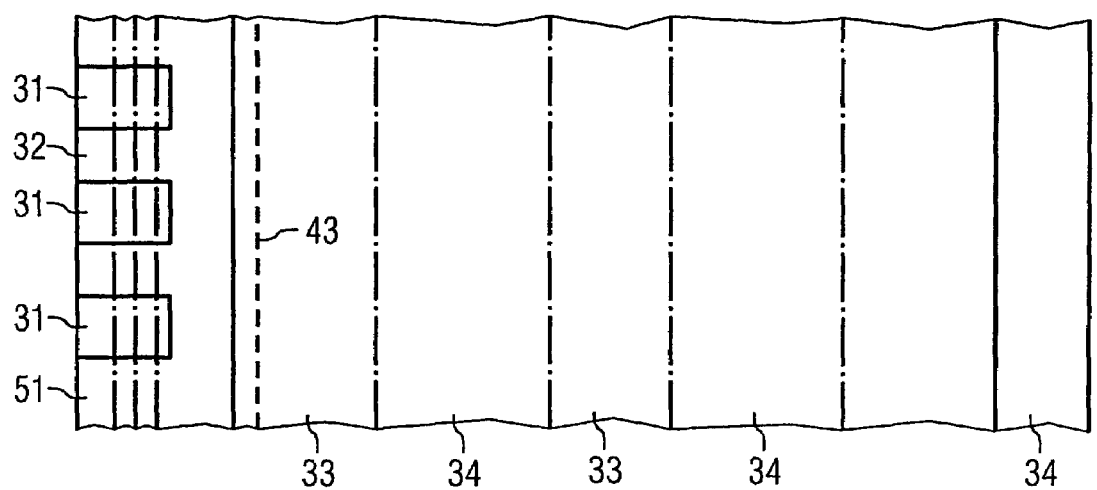
FIG. 3 shows a cross section through the semiconductor layer in the components in accordance with FIGS. 1 and 2.

Referring to FIG. 3, in which the terminal electrode 51 arranged above the semiconductor layer 30 is illustrated in dashed-dotted fashion, the terminal electrode 51 short-circuits the source zone 31 and the body zone 32. For this purpose, the body zone 32 has a comblike structure with body zone sections that extend between two sections of the source zone 31 to below the terminal electrode 51. A gate electrode 43 arranged adjacent to the body zone 32 and insulated from the body zone 32 by means of a gate dielectric 41 is present in order to control an inversion channel in the body zone 32. Said gate electrode 43 extends in the lateral direction proceeding from the source zone 31 over the body zone 32 as far as the drift zone 33 and is also insulated from the source zone 31 and the drift zone 33 by means of the gate dielectric layer 41.

A terminal zone 34 is adjacent to an end of the drift zone 33 that is remote from the body zone 32, which terminal zone is doped more highly than the drift zone 33 and fulfils the function of a drain zone. Said drain zone is of the same conduction type as the drift zone 33 in the case where the MOS transistor is realized as a MOSFET, and of a complementary conduction type with respect to the conduction type of the drift zone 33 in the case where the MOS transistor is realized as an IGBT. A second terminal electrode 53 makes contact with the drain zone 34. The first and second terminal electrodes 51, 53 comprise a metal or a highly doped polysilicon, by way of example.

A first semiconductor zone 11 doped complementarily with respect to a basic doping of the semiconductor substrate 10 is provided in the semiconductor substrate 10. Optionally, a second semiconductor zone 12 doped complementarily with respect to the semiconductor substrate 10 is additionally provided. The first and second semiconductor zones 11, 12 are arranged at a distance from one another in the lateral direction of the semiconductor substrate 10, that is to say a direction along the dielectric layer 20. In this case, the first semiconductor zone 11 is arranged in the region beneath the source zone 31 and the body zone 32 and the second semiconductor zone 12 is arranged in the region beneath the drain zone 34. The drain zone 34 is connected by means of the second terminal electrode 53 to the second semiconductor zone 12 in the semiconductor substrate 10. For this purpose, the insulation layer 20 has a first cutout 21, via which the terminal electrode 53 reaches as far as the semiconductor substrate 10. A further terminal electrode 52 makes contact with the first semiconductor zone 11 and reaches as far as the first semiconductor zone 11 in the semiconductor substrate 10 via a further cutout in the dielectric layer 20.

A channel stop zone 15 is optionally present, which in the example is adjacent to the second semiconductor zone 12 and is doped by the same conductivity type as the semiconductor substrate 10 but more highly.

A rectifier element 61 is connected between the first terminal electrode 51 and the first semiconductor zone 11, which rectifier element is realized as a diode in the example in accordance with FIG. 1 and is represented merely schematically in the form of the circuit symbol in FIG. 1. In a manner that is not specifically illustrated, said diode may be realized in a section of the semiconductor layer 30 or a further semiconductor layer in a known manner by provision of two mutually adjoining semiconductor zones that are doped complementarily with respect to one another and form a pn junction.

Field zones 13, two field zones 13 in the example illustrated, are provided between the first and second semiconductor zones 11, 12 in the semiconductor substrate 10. Said field zones 13 are respectively arranged at a distance from one another and at a distance from the first and second semiconductor zones 11, 12 and are in each case directly adjacent to the dielectric layer 20.

There is optionally the possibility of providing field plates 71 above the semiconductor layer 30, said field plates being insulated from the semiconductor layer 30 via a further dielectric layer 42. Said field plates 71 may be arranged in floating fashion or may be coupled to the field zones 13 in a manner that is known in principle, as described in WO 2005/076366 A2 mentioned in the introduction. Moreover, there is the possibility of forming the first and second terminal electrodes 51, 53 as field electrodes in sections, as is illustrated by dashed lines for the second terminal electrode 53 in FIG. 1. The field electrode section of said terminal electrode 53 is in this case designated by the reference symbol 72.

The functioning of the SOI component illustrated in FIG. 1 is explained below. It is assumed for the purposes of the explanation that the load path of the MOS transistor, that is to say the drain-source path thereof, is connected in series with a load Z between terminals for a positive supply potential V+ and a negative supply potential or reference potential GND. This interterminal is illustrated in dashed-dotted fashion in FIG. 1. In this case, the load Z is connected between the drain terminal electrode 53 and the positive supply potential V+, and the source terminal electrode 51 is connected to reference potential GND.

It is additionally assumed for the explanation below that the MOS transistor is realized as an n-channel MOSFET. The source zone 31, the drift zone 33 and the drain zone 34 are n-doped in this case, and the body zone 32 is p-doped. Moreover, it is assumed that the semiconductor substrate 10 is n-doped, while the first and second semiconductor zones 11, 12 and the field zones 13 are p-doped.

The component shall firstly be considered in the off state, that is to say when the gate electrode 43 is driven in such a way that no inversion channel is formed in the body zone 32 between the source zone 31 and the drift zone 33. The voltage present between the terminals for the positive supply potential V+ and reference potential GND is completely present between the drain zone 34 and the source and body zones 31, 32 during this operating state. When the component is driven in the off state, a space charge zone propagates in the drift zone 33 proceeding from a pn junction 36 between the body zone 32 and the drift zone 33 in the direction of the drain zone 34. In this case, the extent of said space charge zone in the direction of the drain zone 34 is all the greater, the higher the voltage present, which may be up to a few hundred volts.

When the component is driven in the off state, a space charge zone propagates in the semiconductor substrate 10 proceeding from the first semiconductor zone 11 in the direction of the second semiconductor zone 12. Equipotential lines of the electric field in the drift zone 33 and the semiconductor substrate 10 are illustrated schematically in FIG. 1 by dotted lines designated by the reference symbols 101, 102. The field zones 13 may be doped such that they cannot be fully depleted with a propagating space charge zone. The field zones 13 may also be doped such that they are fully depleted of charge carriers in the off-state case. This is more advantageous with regard to optimization of the dielectric strength of the component and with regard to minimizing the dimensions of the field zones. However, such depletable field zones are more difficult to produce taking account of process inaccuracies.

The field zones 13 influence in a known manner the field profile of the electric field in the semiconductor substrate 10 in such a way that the profile of the electric field along the dielectric layer 20 approximately corresponds to the profile of the electric field in the drift zone 13, which results in a low voltage loading on the dielectric layer 20. Whereas in the drift zone 33 in the off-state case the electrical potential increases continuously in the direction of the drain zone 34 proceeding from the pn junction 36, the potential within the field zones 13 is identical in each case. The potential assumed by the individual field zones 13 corresponds here to the potential of the electric field in the semiconductor substrate 10 in each case at the edge of the field zones 13 that lies in the direction of the first semiconductor zone 11. On account of the constant potential within the field zones 13 and on account of the increasing potential in the drift zone 13 in the direction of the drain zone 34, in the region of the field zone 13 there is a voltage present across the dielectric layer 20 which increases within one of the field zones 13 in each case in the direction of the drain zone 34.

The field zones 13 are capacitively coupled to the drift zone 33 via the dielectric layer 20, so that the field zones 13, in the off-state case, compensate for a portion of the dopant charge present in the drift zone 33. This effect is comparable to the compensation effect of field plates in the case of the field plate components explained in the introduction. This compensation effect leads to an increase in the dielectric strength compared with components that do not comprise such field zones 13. This is tantamount to the fact that an increase in the doping in the drift zone can be provided in the case of a component comprising field zones 13 compared with a component without such field zones given the same dielectric strength, which then leads to a reduction of the on resistance in the case of the component comprising field zones given the same dielectric strength.

Figure 2:
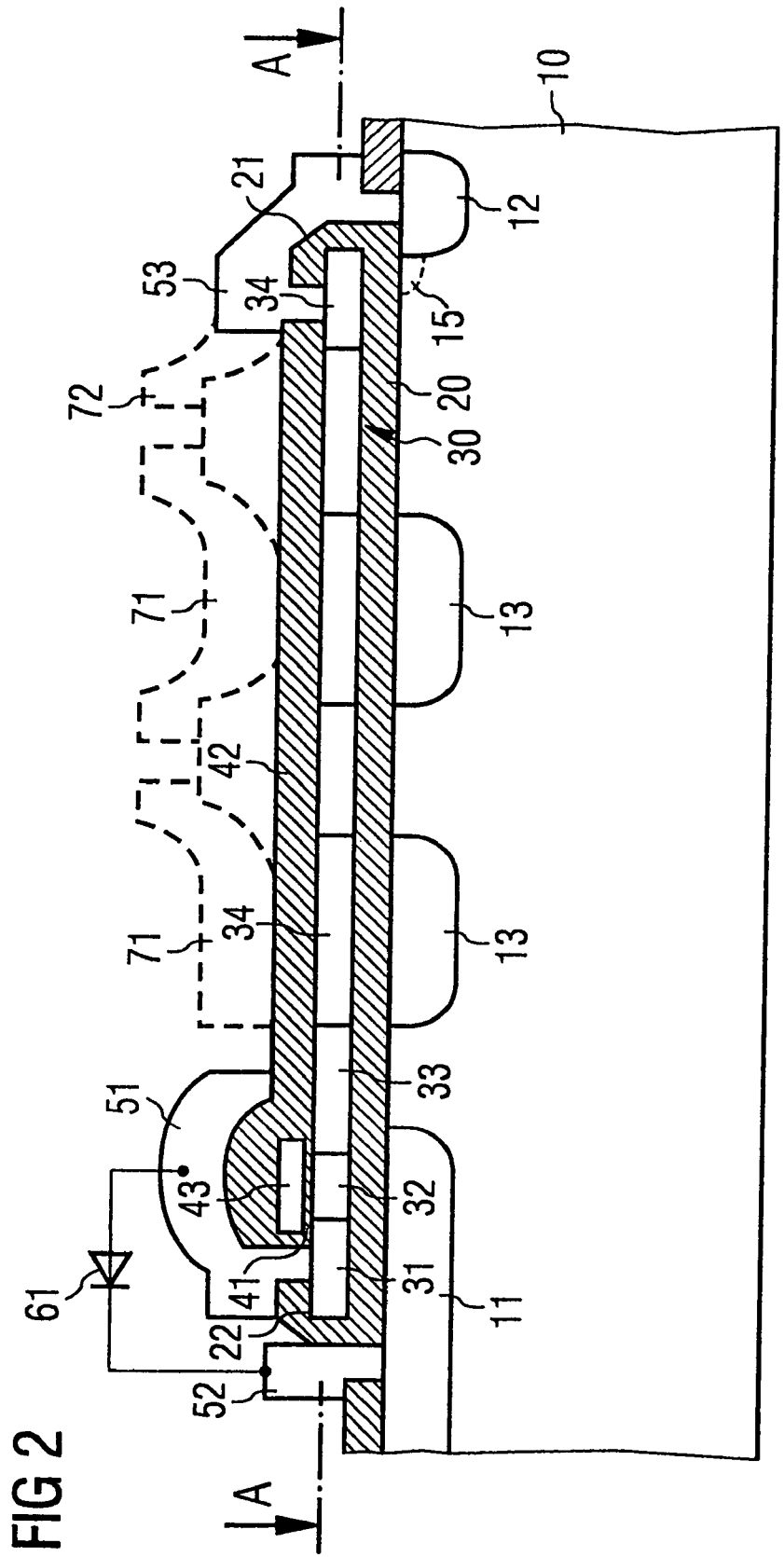
FIG. 2 shows a modification of the semiconductor component illustrated in FIG. 1, in which the drift zone has drift zone sections having different levels of doping.

FIG. 2 shows an alternative embodiment of the invention with a modification of the component illustrated in FIG. 1, in which more highly doped drift zone sections 34 are provided in the semiconductor layer 30 above the field zones 13, said sections being more highly doped than the remaining sections of the drift zone, in particular than the drift zone section that is directly adjacent to the body zone 32.

The function of the components in accordance with FIGS. 1 and 2 in the on state shall now be considered below. In the on state of the component, an inversion channel is formed between the source zone 31 and the drift zone 33 in the body zone 32 by suitable driving of the gate electrode 43. In this case, a voltage drop between the first and second terminal electrodes 51, 53 is essentially determined by the electrical resistance of the drift zone 33. In the case of a power MOSFET, which may have a dielectric strength of a few hundreds of volts, the voltage drop in the on state is usually in the region of a few volts.

The semiconductor substrate 10 is at the potential of the second terminal electrode 53 via the second semiconductor zone 12, said potential, in the case of the external interterminal of the MOSFET illustrated in FIG. 1, being higher than the potential at the first terminal electrode 51. In this case, the rectifier element 61 ensures that the potential of the first semiconductor zone 11 with the component in the on state does not follow the potential at the first terminal electrode 51, but rather lies above said potential at the first terminal electrode 51 and thus above the potential of the source and body zones 31, 32 of the MOSFET. What is thereby achieved is that the semiconductor substrate 10, in intermediate zones 14 which are arranged between the field zones 13 and between the first semiconductor zone 11 and a field zone 13 and which are adjacent to the dielectric layer 20, is at a higher potential than the drift zone 13, to be precise in particular than the drift zone in regions in the vicinity of the body zone 32. This potential difference between the semiconductor substrate 10 and the drain zone 34 increases with increasing distance from the drain zone 34 in this case.

Said potential difference between the semiconductor substrate 10 and the drift zone leads to an accumulation of majority charge carriers along the dielectric layer 20 in the drift zone 33 during the on state. This charge carrier accumulation in the drift zone 33 above the intermediate regions 14 provides for a reduction of the on resistance of the component during the on state. In the semiconductor substrate 10, an excess of holes is present in the intermediate regions 14 during this operating state. In this case, the diode 61 ensures that said holes are held in the substrate 10 in order to obtain this accumulation effect.

The doping concentration of the semiconductor substrate is chosen such that a space charge zone propagates in the substrate 10 in the off-state case. A doping of the semiconductor substrate and the dimensions thereof in the vertical direction, that is to say the direction perpendicular to the dielectric layer 20, are chosen, however, such that the space charge zone cannot reach a surface of the semiconductor substrate that is opposite to the dielectric layer 20. Consequently, the substrate cannot be fully depleted in the vertical direction, that is to say that the dopant dose in the vertical direction lies above the breakdown charge of the semiconductor material of the substrate, which comprises silicon, for example.

The concept explained above is not restricted to MOSFETs, but rather can be applied to any semiconductor components having a drift zone. The concept can in particular also be applied to IGBTs, an IGBT being obtained, referring to FIG. 1, by the drain zone 34 being doped complementarily with respect to the drift zone 33.

Figure 4:
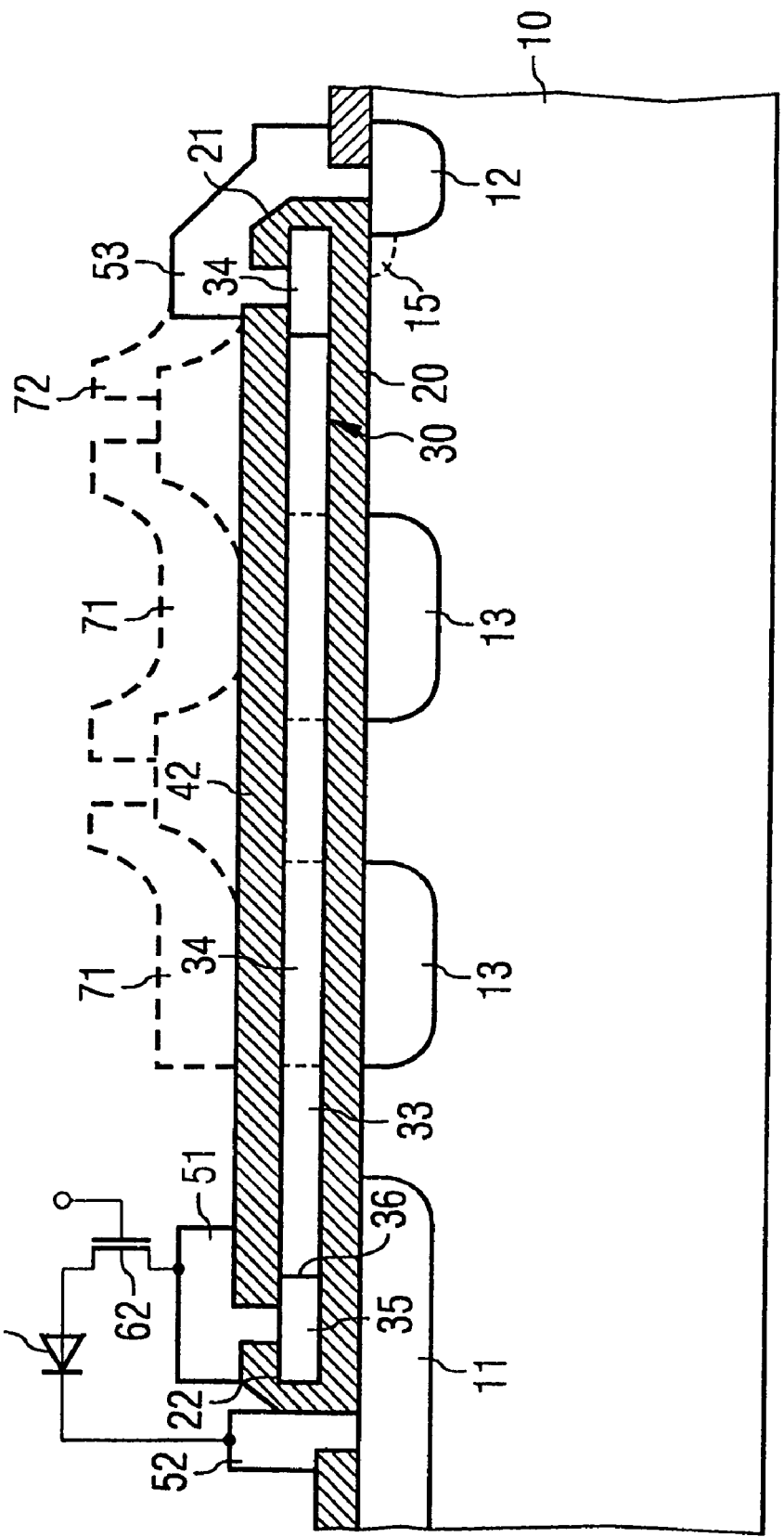
FIG. 4 shows an SOI semiconductor component according to at least one embodiment of the invention that is formed as a diode.

Referring to FIG. 4, the concept according to at least one embodiment of the invention can also be applied to diodes. FIG. 4 shows a semiconductor component that is formed as a diode, the component regions which correspond to the component regions of the MOSFETs in accordance with FIGS. 1 and 2 being designated by the same reference symbols in FIG. 4.

A diode structure realized in the semiconductor layer 30 comprises, alongside a drift zone 33, a component zone 35 adjacent to the drift zone 33 and doped complementarily with respect to the drift zone 33, the first terminal electrode 51 making contact with said component zone. A pn junction 36 is formed between this further component zone 35 and the drift zone 33. In the case where the drift zone 33 is realized as an n-doped zone, the further terminal zone 35 is p-doped and then corresponds to the anode zone of the component. In this case, a terminal zone 34 adjacent to the drift zone 33 at the zone remote from the component zone 35 is doped by the same conduction type as the drift zone 33 but more highly, and forms a cathode zone 34 of said diode. Said cathode zone 34 is connected to the second terminal electrode 53, which connects the cathode zone 34 to the second semiconductor zone 12 in the semiconductor substrate 10.

The first terminal electrode 51 is connected via the rectifier element 61 to the further terminal electrode 52 and thus to the first semiconductor zone 11.

As is illustrated schematically in FIG. 4, there is also the possibility of connecting a MOS transistor between the first terminal electrode 51 of the diode and the further terminal electrode 52, which MOS transistor may be integrated at a different location in the semiconductor layer 30 or in a further semiconductor layer on the insulation layer 20. Said MOS transistor serves only as a switch and need not be embodied in a manner resistant to high voltages since, in the off-state case, the reverse voltage is taken up by means of the drift zone 33 of the series-connected diode.

Figure 5:
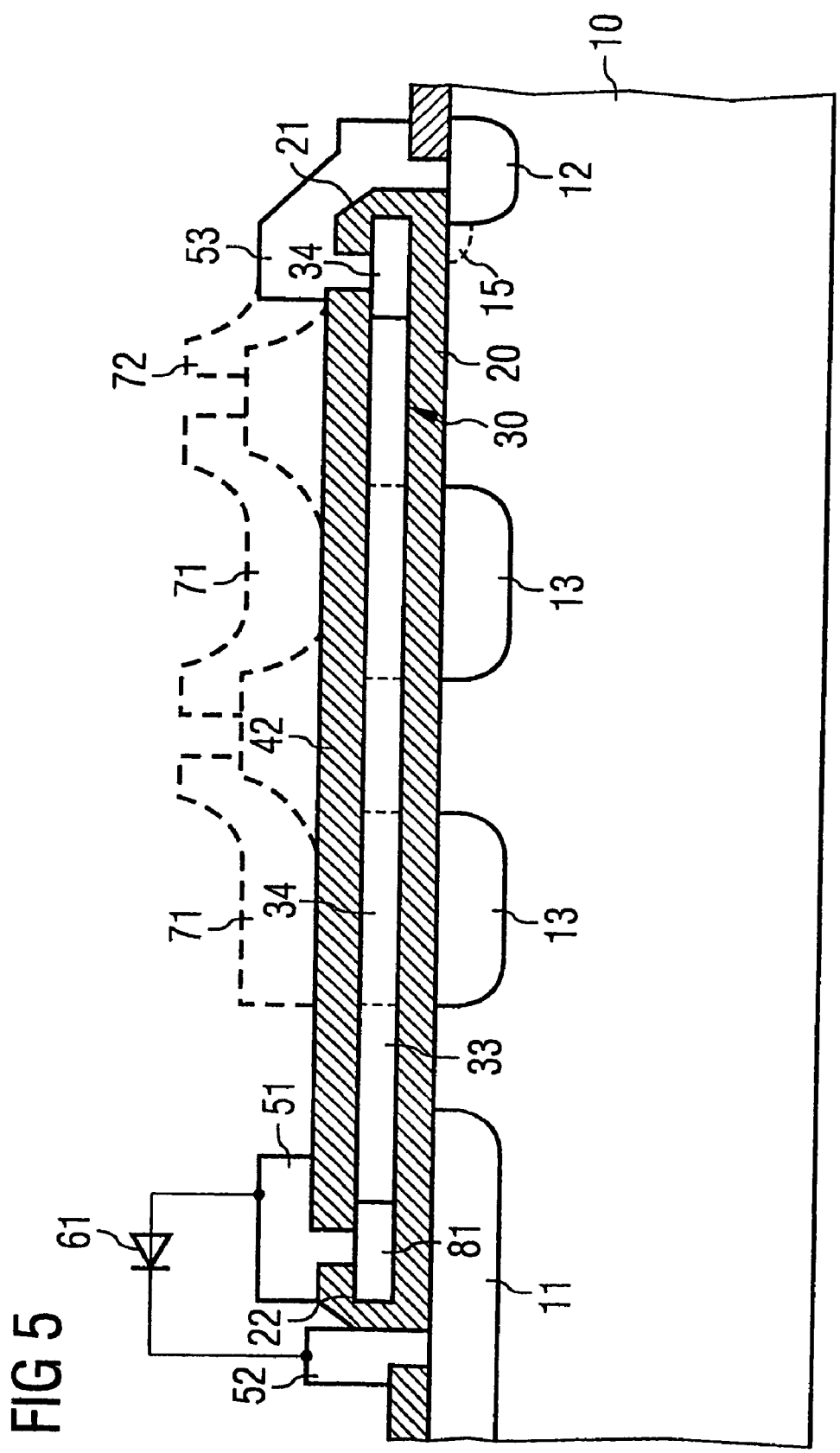
FIG. 5 shows an SOI semiconductor component according to at least one embodiment of the invention that is formed as a Schottky diode.

Referring to FIG. 5, the diode may also be realized as a Schottky diode. This Schottky diode differs from the diode illustrated in FIG. 4 essentially by the fact that a Schottky metal zone 8 is provided instead of the p-doped anode zone 35. In contrast to the pn diode in accordance with FIG. 4, the Schottky diode is a unipolar component in which the above-explained accumulation of charge carriers in the drift zone 33 under the control of the semiconductor substrate 10 leads to a more pronounced effect with regard to the reduction of the on resistance than in the case of the bipolar pn diode.

Figure 6:
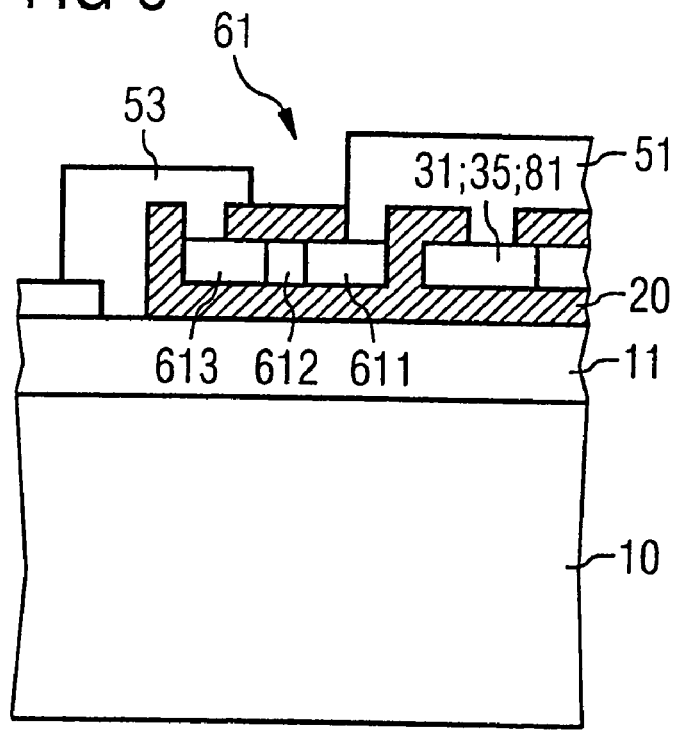
FIG. 6 illustrates one possibility for realizing a rectifier element in a semiconductor layer above the insulation layer.

FIG. 6 illustrates one possible realization of a rectifier element 61 realized as a pn diode. This diode is integrated in a further semiconductor layer arranged above the dielectric layer 20 and adjacent to the semiconductor layer 30 in the lateral direction. The diode 61 comprises an anode zone 611, an optionally present more weakly doped base zone 612 and a cathode zone 613, which are arranged successively in the lateral direction in said further semiconductor layer. The first terminal electrode 51 makes contact with the anode zone 611 of this diode, and the further terminal electrode 53 makes contact with the cathode zone 613.

Figure 7:
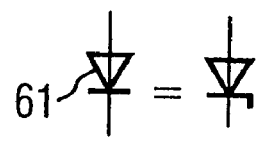
FIG. 7 illustrates the possibility of realizing the rectifier element present in the semiconductor component according to at least one embodiment of the invention as a Zener diode.
Figure 8:
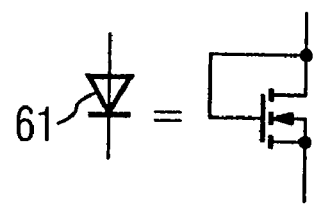
FIG. 8 illustrates the realization of the rectifier element as a MOSFET connected up as a diode.

Furthermore, there is the possibility of realizing the rectifier element as a Zener diode, referring to FIG. 7, or as a MOSFET connected up as a diode, referring to FIG. 8.

While the invention disclosed herein has been described in terms of several preferred embodiments, there are numerous alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A semiconductor component comprising:
   a semiconductor substrate having a basic doping, the semiconductor substrate including a first semiconductor zone doped complimentary with respect to the basic doping of the semiconductor substrate;
   a dielectric layer arranged on the semiconductor substrate;

a semiconductor layer arranged on the dielectric layer, the semiconductor layer including a drift zone of a first conduction type, a junction between the drift zone and a further component zone, and a terminal zone adjacent to the drift zone, wherein the junction is configured in such a way that a space charge zone is formed in the drift zone when a reverse voltage is applied to the junction;

a first terminal electrode connected to the further component zone and connected to the first semiconductor zone;

a second terminal electrode connected to the terminal zone; and a rectifier element connected between the first terminal electrode and the first semiconductor zone.

2. The semiconductor component of claim 1 wherein the rectifier element is a diode, a Zener diode or a MOSFET connected up as a diode.

3. The semiconductor component of claim 1 wherein a second semiconductor zone doped complementarily with respect to the basic doping of the semiconductor substrate is arranged in the semiconductor substrate, and wherein a second terminal electrode is connected to the second semiconductor zone.

4. The semiconductor component of claim 3 wherein a channel stop zone that is doped by the same conduction type as the basic doping of the semiconductor substrate but more highly is arranged in the semiconductor substrate adjacent to the dielectric layer and one of the first or second semiconductor zones.

5. The semiconductor component of claim 1 wherein at least one field zone that is doped complementarily with respect to the basic doping of the semiconductor substrate is arranged at a distance from the first semiconductor zone in the semiconductor substrate.

6. The semiconductor component of claim 5 wherein the drift zone has, adjacent to the at least one field zone, a drift zone section that is doped more highly than remaining drift zone sections.

7. The semiconductor component of claim 1 further comprising at least one field electrode which is arranged above the semiconductor layer and is insulated from the semiconductor layer by a dielectric layer.

8. The semiconductor component of claim 7 wherein the at least one field electrode is coupled to the at least one field zone.

9. The semiconductor component of claim 1 wherein the semiconductor component is formed as a MOS transistor, wherein the further component zone is a body zone doped complementarily with respect to the drift zone and wherein the terminal zone is a drain zone.

10. The semiconductor component of claim 9 further comprising a source zone arranged in a manner separated from the drift zone by the body zone, the source zone short-circuited with the body zone.

11. The semiconductor component of claim 10 further comprising a gate electrode arranged adjacent to the body zone and insulated from the body zone by means of a gate dielectric.

12. The semiconductor component of claim 11 wherein the semiconductor component is formed as a MOSFET, and wherein the drain zone is of the same conduction type as the drift zone.

13. The semiconductor component of claim 11 wherein the semiconductor component is formed as an IGBT, and wherein the drain zone is doped complementarily with respect to the drift zone.

14. The semiconductor component of claim 1 wherein the semiconductor component is formed as a diode, and wherein the further component zone is a semiconductor zone doped complementarily with respect to the drift zone.

15. The semiconductor component of claim 1 wherein the semiconductor component is formed as a Schottky diode, wherein the further component zone is a Schottky metal zone, and wherein the terminal zone is a cathode zone that is doped by the same conduction type as the drift zone but more highly.

16. A semiconductor component comprising:

a semiconductor substrate having a basic doping, the semiconductor substrate including a first semiconductor zone doped complimentary with respect to the basic doping;

a dielectric layer adjacent to the semiconductor substrate;

a semiconductor layer adjacent to the dielectric layer, the semiconductor layer including a drift zone of a first conduction type, a further component zone adjacent to the drift zone, and a terminal zone adjacent to the drift zone;

a first terminal electrode connected to the further component zone and connected to the first semiconductor zone;

a second terminal electrode connected to the terminal zone; and a rectifier element connected between the first terminal electrode and the first semiconductor zone.

17. The semiconductor component of claim 16 wherein the rectifier element is a diode, a Zener diode or a MOSFET connected up as a diode.

18. The semiconductor component of claim 16 wherein a second semiconductor zone doped complementarily with respect to the basic doping of the semiconductor substrate is arranged in the semiconductor substrate, and wherein a second terminal electrode is connected to the second semiconductor zone.

19. The semiconductor component of claim 16 further comprising a further terminal electrode connected to the first semiconductor zone, wherein the rectifier element is positioned between the first terminal electrode and the further terminal electrode to connect the first terminal electrode to the first semiconductor zone.

20. The semiconductor component of claim 16 wherein the further component zone is a body zone doped complementarily with respect to the drift zone, the semiconductor layer further comprising a source zone arranged in a manner separated from the drift zone by the body zone.

* * * * *